(12) United States Patent
Goldacker et al.

(10) Patent No.: US 9,390,840 B2
(45) Date of Patent: Jul. 12, 2016

(54) INSULATED HIGH-TEMPERATURE WIRE SUPERCONDUCTOR AND METHOD FOR PRODUCING SAME

(75) Inventors: Wilfried Goldacker, Heidelberg (DE); Stefan Fink, Offenburg (DE); Andrej Kudymow, Stutensee-Spoeck (DE); Steffen Elschner, Heidelberg (DE); Joerg Brand, Oberhausen-Rheinhausen (DE)

(73) Assignee: KARLSRUHER INSTITUT FUER TECHNOLOGIE, Karlsruhe (DE)

( * ) Notice: Subject to any disclaimer, the term of this patent is extended or adjusted under 35 U.S.C. 154(b) by 290 days.

(21) Appl. No.: 14/130,708

(22) PCT Filed: Jul. 4, 2012

(86) PCT No.: PCT/EP2012/002847
§ 371 (c)(1),
(2), (4) Date: Mar. 12, 2014

(87) PCT Pub. No.: WO2013/004392
PCT Pub. Date: Jan. 10, 2013

(65) Prior Publication Data
US 2014/0187428 A1    Jul. 3, 2014

(30) Foreign Application Priority Data

Jul. 6, 2011  (DE) .......................... 10 2011 107 313

(51) Int. Cl.
*H01B 12/14*         (2006.01)
*H01L 39/14*         (2006.01)
(Continued)

(52) U.S. Cl.
CPC ................ *H01B 12/14* (2013.01); *H01B 13/06* (2013.01); *H01L 39/143* (2013.01); *H01L 39/16* (2013.01); *H01L 39/2419* (2013.01); *H01B 12/06* (2013.01); *Y02E 40/642* (2013.01)

(58) Field of Classification Search
CPC ...... H01B 12/14; H01B 12/06; H01L 39/143; H01L 39/16; H01L 39/2419
See application file for complete search history.

(56) References Cited

U.S. PATENT DOCUMENTS

| 5,861,788 A  * | 1/1999 | Ohkura ..................... H01F 6/06 335/216 |
| 8,255,024 B2 * | 8/2012 | Kramer ................... H01L 39/16 336/207 |

(Continued)

FOREIGN PATENT DOCUMENTS

| DE | 19755445 A1   | 2/1999 |
| DE | 102006032702 B3 | 10/2007 |
| EP | 0807939 A1 | 11/1997 |
| EP | 1075030 A2 | 2/2011 |

(Continued)

OTHER PUBLICATIONS

SuperPower Inc., "2G HTS Wire", http://www.superpower-inc.com/content/2g-hts-wire,, Dec. 12, 2013.
(Continued)

*Primary Examiner* — Colleen Dunn
(74) *Attorney, Agent, or Firm* — Leydig, Voit & Mayer, Ltd.

(57) ABSTRACT

An insulated high-temperature wire superconductor includes a wire of a non-insulated high-temperature wire superconductor, the width of which is at least 10 times its thickness and in which a high-temperature superconductor is introduced into a matrix or is applied to a substrate. The wire is provided with an electrically non-conducting insulating layer on both sides such that the two insulating layers have an insulating edge width in a range from 2 mm to 200 mm which projects in relation to the wire.

12 Claims, 2 Drawing Sheets

(51) Int. Cl.
*H01L 39/16* (2006.01)
*H01L 39/24* (2006.01)
*H01B 13/06* (2006.01)
*H01B 12/06* (2006.01)

(56) References Cited

U.S. PATENT DOCUMENTS

2002/0190419 A1* 12/2002 Albrecht ............ H01B 13/14 264/171.14
2005/0058769 A1* 3/2005 Arndt ............ H01B 12/02 427/62
2009/0286685 A1 11/2009 Kraemer et al.

FOREIGN PATENT DOCUMENTS

WO WO 0161712 A1 8/2001
WO WO 03073439 A1 9/2003

OTHER PUBLICATIONS

Schmidt, et al., "Supraleitende Strombegrenyer aus YBCCO-Bandleitern", 4. Braunschweiger Supraleiter—Seminar, May 12-13, 2009, pp. 1-33.

Amperium Wire Insulation, „Thin Kapton polyimide film spiral wrapped adhesive insulation for superb durability and voltage withstand, http://www.amsc.com/products/htswire/InsulatedWire.html, Sep. 2010.

* cited by examiner

INSULATED HIGH-TEMPERATURE WIRE SUPERCONDUCTOR AND METHOD FOR PRODUCING SAME

CROSS-REFERENCE TO PRIOR APPLICATIONS

This application is a U.S. National Phase application under 35 U.S.C. §371 of International Application No. PCT/EP2012/002847, filed on Jul. 4, 2012, and claims benefit to German Patent Application No. DE 10 2011 107 313.6, filed on Jul. 6, 2011. The International Application was published in German on Jan. 10, 2013 as WO 2013/004392 under PCT Article 21(2).

FIELD

The invention relates to an insulated high-temperature wire superconductor and a method for producing the same.

BACKGROUND

Superconductors are materials, which exhibit no measurable resistance below a critical temperature $T_c$. Superconductor materials also have a critical current $1_c$, above which the material is normally conductive and below which the material is superconductive. $I_c$ depends on the temperature and the external magnetic field.

Materials with a critical temperature>20 K are described as high-temperature superconductors (HTS). Because of their thin construction $2^{nd}$ generation high-temperature superconductors (2G HTS) are particularly suitable for this insulation. These have superconductive layers with a thickness of 1-10 μm, preferably of yttrium barium copper oxide (YBCO), which are applied to a 10-200 μm thick, electrically conductive substrate, in particular of a nickel chrome molybdenum alloy known as Hastelloy C276, or of a nickel tungsten alloy. The company SuperPower Inc. shows the construction of a 2G HTS wire on its website, <<http://www.superpowerinc.com/content/2 g-hts-wire>>.

In the superconductive components of resistive current limiters, the arrangement of the $2^{nd}$ generation high-temperature wire superconductor is typically flat bifilar pancake spirals, as presented by W. Schmidt and H.-P. Kramer in the $4^{th}$ Braunschweig Superconductivity Seminar, 2009; see page 12 of the presentation at <<http://www.tu-braunschweig.de/Medien-DB/iot/8-supraleitende-strombegrenzer-aus-ybco-bandleitern-h-p-kraemer.pdf>>.

When designing the insulation of these bifilar spirals the following physical effects are to be observed:
- When the current flows through twists of the spirals Lorentz forces act, having a symmetrising effect in the radial direction. In the axial direction, unavoidable minimal asymmetries in the construction of the spirals, however, have a destabilising effect (force acting on adjacent conductors in the opposite axial direction), the following being the case: the greater the asymmetry the greater the force.
- When alternating frequency is used, the conductor vibrates at double the frequency, i.e. if the applied supply frequency is 50 Hz then 100 Hz vibrations occur in the conductor.
- When quenched in a nitrogen bath, additional gas formation and pressure build-up act on the conductor. When liquid nitrogen vaporises, about 700 times the volume of gas is created, i.e. the liquid that has penetrated below the insulation can inflate and damage the insulation during quenching.

In bifilar spirals, high-voltage insulation with a useful thickness adjusted to the voltage values is required. Known insulation methods for high-temperature superconductors are wrapping, varnishing and co-extrusion, which have overall problems with the sharp edges of the 2G HTS however. Because of the 100 Hz vibrations referred to, sharp edges bring about the risk of abrasion with damage to the thin insulating layer in the region of the edge.

Wrapping is only possible with very thin layers of insulation because of the sharp bend at the edge of a wire. Overlapping is unavoidable and as a result a conductor of irregular thickness is maintained. This is shown by way of example on the datasheet *Amperium Wire Insulation* (September 2010) by the company American Superconductor, which is available on the Internet at <<http://www.amsc.com/products/htswire/InsulatedWire.html>>.

Insulation by means of varnishing is also difficult to produce because, for example, in the case of a 100 μm thick conductor a 100 μm thick layer of varnish cannot be achieved.

Co-extrusion for high-temperature superconductors is known from WO 01/61712 A1 and WO 03/073439 A1.

SUMMARY

In an embodiment, the present invention provides an insulated high-temperature wire superconductor which includes a wire of a non-insulated high-temperature wire superconductor, the width of which is at least 10 times its thickness and in which a high-temperature superconductor is disposed in a matrix or on a substrate. The wire is provided with an electrically non-conducting insulating layer on both sides such that the two insulating layers have an insulating edge width in a range from 2 mm to 200 mm which projects in relation to the wire.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
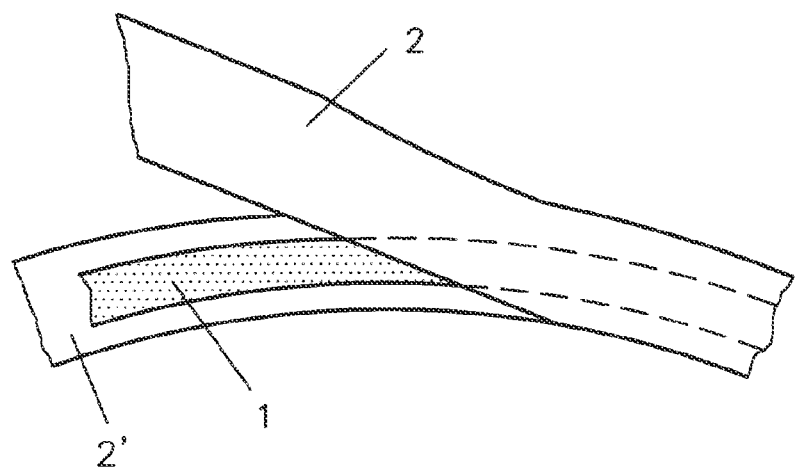
FIG. 1 shows a schematic view of an insulated high-temperature wire superconductor.

In an embodiment, the present invention overcomes the disadvantages and limitations of prior art discussed above.

In particular, insulation for a wire of a $2^{nd}$ generation high-temperature wire superconductor is to be produced from a single, adequately thick, smooth and homogenous layer of insulation, which has the necessary dielectric strength and can be tested for its high-voltage dielectric strength with respect to fissures, pores and defects through outside influences, within the scope of quality control before application. The borders (edges) of the high-temperature wire superconductor should be better protected with such insulation; in particular they should not be exposed directly to the axial Lorentz forces referred to.

According to an embodiment of the invention, an insulated high-temperature wire superconductor has a wire of a non-insulated high-temperature wire superconductor, the width of which is at least 10 times the thickness thereof and in which a high-temperature wire superconductor is introduced into a matrix or is applied to a substrate which is provided, preferably laminated, with an electrically non-conducting insulating layer, preferably a polymer film and particularly preferably of polyimide, on both sides.

In the following:
B denotes the width of the insulated high-temperature wire superconductor;
D denotes the thickness of the insulated high-temperature wire superconductor;
b denotes the width of the wire of the non-insulated high-temperature wire superconductor; and
d denotes the thickness of the wire of the non-insulated high-temperature wire superconductor.

The two insulating layers are applied to the wire of the non-insulated high-temperature wire superconductor such that at the required high voltage dielectric strength, the insulating edge width (B-b), which projects in relation to the wire, is adequate to prevent a flashover across a creepage path, and specifically even if the adhesion of the protrusion is damaged by gas formation or is totally detached.

In a particularly preferred configuration, the two insulating layers are applied to the wire of the non-insulated high-temperature wire superconductor such that at the required high-voltage dielectric strength the thickness of the two insulating layers (D-d) between two adjacent wires is adequate so that no breakdown occurs through two adjacent insulating layers;
the adhesion between the insulating layer and the wire is selected such that neither the wire nor the insulating layer can degrade as a result of the detachment of the insulation by quenching; and
the projecting double insulation edges are in a position to safely control the Lorentz forces referred to above.

In a particularly preferred configuration, the common thickness (D-d) of the two insulating layers (2, 2') assumes a value in the region of 20 µm to 2 mm.

The insulating edge widths (B-b) of 2 mm to 200 mm, preferably from 2 mm to 40 mm, which project in relation to the wire, can be symmetrical in relation to the wire, i.e. the same width on both sides, or asymmetrical, i.e. different widths on either side. In a particularly preferred configuration, the insulating edge width, which projects in relation to the wire, is symmetrical in relation to the wire, and the size (B-b)/2 has a value in the region of 1 mm to 100 mm, preferably 1 to 20 mm, on each side.

The present invention further relates to a method for producing the insulated high-temperature wire superconductor according to the invention. For this purpose, an electrically non-conducting insulating layer is applied to each of both sides of a wire of a non-insulated high-temperature wire superconductor the width of which is at least 10 times its thickness and in which a high-temperature superconductor is introduced into a matrix or applied to a substrate.

In a particularly preferred configuration, an insulating layer is laminated to one side of the wire or to each of both sides of the wire. In a preferred configuration, the lamination is performed with hot adhesive or a heat seal adhesive at a reaction temperature in the region of 100° C. to 250° C., which is applied as a layer to each side of the at least one insulating layer facing the wire.

In particular, the present invention has the following advantages and particular effects:
The high-temperature wire superconductors according to the invention are adequately protected against breakdown and flashover;
each of the sensitive surfaces of the wire are sealed with an insulating layer and protected against abrasion both at the edge and on the surface;
the lamination is applied homogenously and therefore better absorbs any forces in the axial direction;
in contrast to using insulation wrapping, it is possible to achieve adequately good insulation with only one single insulating layer per surface;
in contrast to using wrapping, no mechanical residual stress, which can deform the conductor, occurs;
lamination is less complex than co-extrusion and can be applied more easily to thin, sharp-edged wires.

In certain applications, such as in a twin arrangement, insulation is only needed in one direction. Therefore, the films applied to each side of the wire do not have to be identical here, in particular not in relation to their material or thicknesses.

In a particular configuration, the insulating layer does not adhere to the wire. In this case it is sufficient for a layer of adhesive to be applied to only one of the two films.

According to an embodiment of the invention, a wire of a $1^{st}$ generation non-insulated high-temperature superconductor, which has a substantially greater thickness, can also be used. In this configuration, the insulating layers are preferably pre-structured with a groove provided for the conductor.

FIG. 1 shows a schematic oblique view of a high-temperature wire superconductor according to an embodiment of the invention, where an insulating layer (2, 2') is applied to each of both sides of a wire (1) of a non-insulated high-temperature wire superconductor. One of the insulating layers (2) is shown detached from the wire (1) along a portion here, for illustrative purposes.

The wire (1) used was 50-150 µm thick and had a 1-3 µm thin layer of superconductive yttrium barium copper oxide (YBCO), which was applied to an electrically conductive substrate of nickel chrome molybdenum Hastelloy C276. A polymer polyimide was used as the insulating layer (2, 2'), which was laminated with a polyester resin heat seal adhesive. A value of approx. 130° C. was chosen as the reaction temperature for the lamination.

Figure 2:
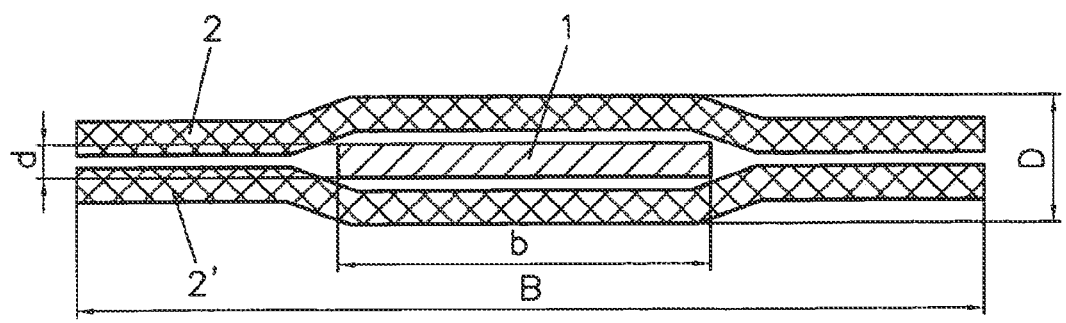
FIG. 2 shows a cross section through an insulated high-temperature wire superconductor.

FIG. 2 shows a cross section through an insulated high-temperature wire superconductor. The wire (1) of a non-insulated high-temperature wire superconductor is provided on each of both sides with an insulating layer (2, 2') in the form of a film. The fact that at least one of the two insulating layers (2, 2') here is laminated with a layer of an adhesive on the side facing the wire (1) is not shown because of the minimal thickness of this layer.

Figure 3:
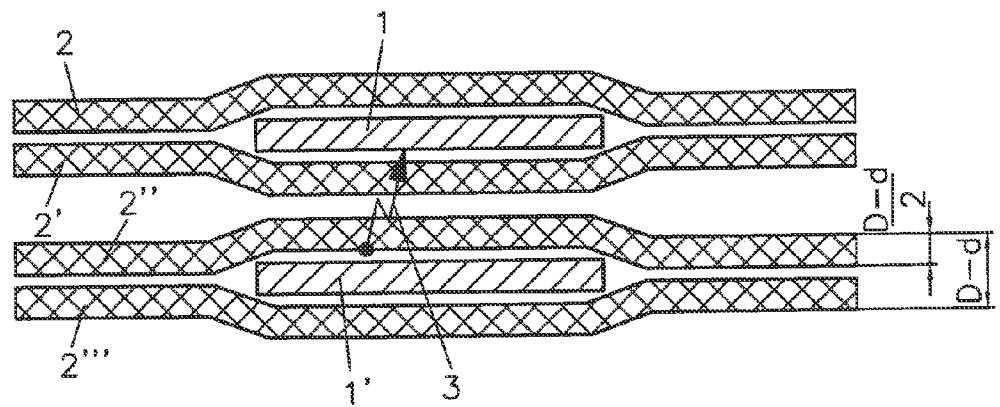
FIG. 3 shows a cross section through two insulated high-temperature wire superconductors placed on top of one another, showing a high-voltage breakdown.

FIG. 3 shows a cross section through two insulated high-temperature wire superconductors placed on top of one another. The common thickness (D-d) of the two insulating layers (2, 2') is selected such that a breakdown (3) through two adjacent insulating layers (2', 2") is prevented when high voltage is used.

Figure 4:
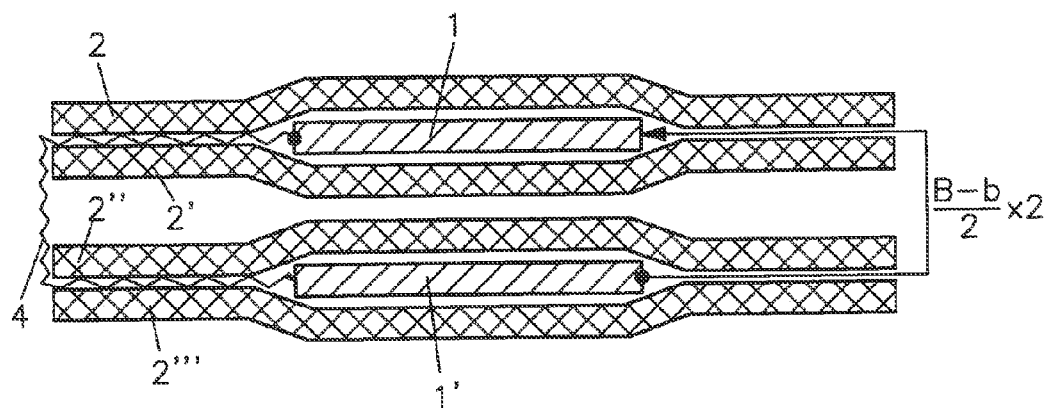
FIG. 4 shows a cross section through two insulated high-temperature wire superconductors placed on top of one another, showing a creepage path during a flashover.

FIG. 4 shows a cross section through two insulated high-temperature wire superconductors placed on top of one another. The symmetrical edge widths (B-b)/2 of each insulating layer (2, 2'), which project in relation to the wire (1), is 4 mm on each of both sides. This value has been selected such that a flashover due to the formation of a creepage path (4) with a length of (B-b) between the two adjacent wires (1, 1') is prevented and specifically even if the adhesion of the projecting edge widths should become damaged or totally detached due to the formation of gas.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An insulated high-temperature wire superconductor, comprising:
    a wire of a non-insulated high-temperature wire superconductor, the width of which is at least 10 times its thickness and in which a high-temperature superconductor is disposed in a matrix or is on a substrate, the wire being provided with an electrically non-conducting insulating layer on both sides such that the two insulating layers have an insulating edge width in a range from 2 mm to 200 mm which projects in relation to the wire.

2. The insulated high-temperature wire superconductor according to claim 1, wherein the two insulating layers have a common thickness of 20 µm to 2 mm.

3. The insulated high-temperature wire superconductor according to claim 1, wherein at least one of the two insulating layers is laminated on one side of the wire.

4. The insulated high-temperature wire superconductor according to claim 3, wherein at least one of the two insulating layers is laminated with a layer of an adhesive on the side facing the wire.

5. The insulated high-temperature wire superconductor according to claim 1, wherein, at least one of the two insulating layers consists of at least one polymer.

6. The insulated high-temperature wire superconductor according to claim 5, wherein at least one of the two insulating layers consists of polyimide.

7. A method for producing the insulated high-temperature wire superconductor according to claim 1, the method comprising:
    applying the electrically non-conducting insulating layer to each of both sides of the wire of the non-insulated high-temperature wire superconductor, the width of the wire being at least 10 times its thickness, and where the high-temperature superconductor is introduced into the matrix or applied to the substrate, such that the two insulating layers have the insulation edge width in the range from 2 mm to 200 mm projecting in relation to the wire.

8. The method according to claim 7, the thickness of the insulating layers being selected such that the common thickness is from 20 µm to 2 mm.

9. The method according to claim 7, wherein at least one of the two insulating layers is laminated to a side of the wire.

10. The method according to claim 9, wherein the lamination is performed with a hot adhesive or heat seal adhesive at a reaction temperature in a range from 100° C. to 250° C., for which purpose a side of the at least one insulating layer facing the wire is laminated with the hot adhesive or hot seal adhesive.

11. The method according to claim 7, wherein a film of at least one polymer is used as an insulating layer.

12. The method according to claim 11, wherein a film of polyimide is used as the insulating layer.

* * * * *